(12) United States Patent
Akimoto et al.

(10) Patent No.: US 7,785,499 B2
(45) Date of Patent: Aug. 31, 2010

(54) NICKEL-RHENIUM ALLOY POWDER AND CONDUCTOR PASTE CONTAINING THE SAME

(75) Inventors: Yuji Akimoto, Fukuoka (JP); Kazuro Nagashima, Fukuoka (JP); Tetsuya Kimura, Fukuoka (JP); Yasuhiro Kamahori, Fukuoka (JP)

(73) Assignee: Shoei Chemical Inc., Tokyo (JP)

( * ) Notice: Subject to any disclaimer, the term of this patent is extended or adjusted under 35 U.S.C. 154(b) by 0 days.

(21) Appl. No.: 12/310,744

(22) PCT Filed: Sep. 25, 2007

(86) PCT No.: PCT/JP2007/068519

§ 371 (c)(1),
(2), (4) Date: Mar. 5, 2009

(87) PCT Pub. No.: WO2008/041540

PCT Pub. Date: Apr. 10, 2008

(65) Prior Publication Data

US 2009/0321690 A1 Dec. 31, 2009

(30) Foreign Application Priority Data

Oct. 2, 2006 (JP) ............................. 2006-270671

(51) Int. Cl.
*H01B 1/02* (2006.01)
*C22C 19/03* (2006.01)
(52) U.S. Cl. ...................... 252/513; 420/441
(58) Field of Classification Search ......... 252/512–514, 252/518.1; 420/441; 428/403
See application file for complete search history.

(56) References Cited

U.S. PATENT DOCUMENTS 5,622,638 A * 4/1997 Schell et al. ........... 219/121.64
6,221,181 B1 * 4/2001 Bossmann et al. .......... 148/428
7,503,959 B2 * 3/2009 Akimoto et al. .............. 75/351
2007/0163684 A1 * 7/2007 Hu .............................. 148/528

FOREIGN PATENT DOCUMENTS

| CN | 1598023 | * | 3/2005 |
|---|---|---|---|
| JP | 11-080817 | | 3/1999 |
| JP | 11-189802 | | 7/1999 |
| JP | 11-343501 | | 12/1999 |
| JP | 2000-034531 | | 2/2000 |
| JP | 2000-045001 | | 2/2000 |
| JP | 2002-020809 | | 1/2002 |
| JP | 2002-060877 | | 2/2002 |
| JP | 2004-319435 | | 11/2004 |
| JP | 2007-138280 | | 6/2007 |
| JP | 2007-157563 | | 6/2007 |
| WO | WO 2004/070748 | | 8/2004 |

\* cited by examiner

*Primary Examiner*—Mark Kopec
(74) *Attorney, Agent, or Firm*—Flynn, Thiel, Boutell & Tanis, P.C.

(57) ABSTRACT

The invention provides a nickel-rhenium alloy powder that contains nickel as a main component, 0.1 to 10% by weight of rhenium and 50 to 10,000 ppm of silicon in terms of silicon atoms, and that is suitable, in particular, for the formation of an internal electrode layer for a multilayer ceramic electronic component. The obtained powder is homogeneously mixed and dispersed in an organic vehicle, together with other additives as needed, to prepare a conductor paste. When used in particular for forming an internal electrode of a multilayer ceramic electronic component, the nickel-rhenium alloy powder of the invention delays sintering initiation and slows down the progress of sintering during firing, even for extremely fine powders, while bringing the sintering shrinkage behaviors of electrode layers and ceramic layers closer to each other. Moreover, there occurs no electrode spheroidizing caused by oversintering. A thinner, dense internal electrode having excellent continuity can be formed as a result.

9 Claims, No Drawings

NICKEL-RHENIUM ALLOY POWDER AND CONDUCTOR PASTE CONTAINING THE SAME

TECHNICAL FIELD

The present invention relates to an alloy powder, containing nickel as a main component and used for conductor formation in the field of electronics. In particular, the present invention relates to a nickel-rhenium alloy powder containing nickel as a main component, and to a conductor paste containing the alloy powder, that are suitable for forming internal electrodes of multilayer ceramic electronic components such as multilayer capacitors, multilayer inductors or multilayer actuators.

BACKGROUND ART

A multilayer ceramic electronic component (also referred to hereinbelow as "multilayer electronic component") is usually manufactured in the manner as follows. A ceramic raw material powder, such as a dielectric, magnetic, or piezoelectric material powder, is dispersed in a resin binder and formed into sheets to prepare ceramic green sheets (referred to hereinbelow as "ceramic sheets"). A conductor paste for an internal electrode that is prepared by dispersing an inorganic powder comprising an electrically conductive powder as the main component and, optionally, a ceramic powder or the like in a vehicle comprising a resin binder and a solvent is printed according to a predetermined pattern on the ceramic sheets and dried to remove the solvent and form dry films of the inner electrodes. A plurality of ceramic sheets each having the dry film of the inner electrode that were thus obtained are laminated and pressurized to obtain a non-fired laminate in which the ceramic sheets and paste layers of inner electrodes are alternately laminated. The laminate is cut to a predetermined shape, then subjected to a binder removal process in which the binder is thermally decomposed and dissipated, and fired at a high temperature whereby sintering of the ceramic layers and formation of the inner electrode layers are conducted simultaneously and a ceramic body is obtained. Terminal electrodes are then fired to both end surfaces of the body and a multilayer electronic component is obtained. The terminal electrodes and the unfired multilayer body are sometimes co-fired.

In recent years powders of base metals such as nickel and copper are mainly used instead of powders of noble metals such as palladium and silver as electrically conductive powders of conductor pastes for inner electrodes. Accordingly, firing of the laminate is usually carried out in a non-oxidizing atmosphere with an extremely low partial pressure of oxygen in order to prevent the oxidation of the base metals during firing.

There has been in recent years an ongoing trend towards smaller multilayer electronic components having higher layer counts. In particular, ceramic layers and internal electrode layers are becoming ever thinner in multilayer ceramic capacitors using nickel as a conductive powder.

However, the firing temperature of the capacitor is ordinarily 1200° C. or higher, which may give rise to oversintering of the nickel powder in internal electrodes. This oversintering causes various problems such as large voids after firing that result in an increase in resistance and greater apparent electrode thickness through spheroidization of electrodes brought about by excessive particle growth. These problems impose limits as to how thin the internal electrodes can be.

To render the electrodes thinner, conductor pastes for internal electrodes have come to use extremely fine nickel powders having a particle size of no greater than 1 μm, and even no greater than 0.5 μm. Such fine nickel powders have a high activity and a very low sintering initiation temperature. This leads to a disruption of the internal electrodes, since sintering starts at an early stage of firing. Specifically, when nickel particles are fired in a non-oxidizing atmosphere, even single-crystal particles with comparatively low activity begin to sinter and shrink at a low temperature of 400° C. or lower. By contrast, the temperature at which the ceramic particles comprised in the ceramic sheet begin to sinter is generally much higher than this. When co-fired together with the internal electrode paste comprising the above nickel powder, the ceramic layers fail to shrink together with the nickel films, as a result of which the nickel films are pulled in the planar direction. The small voids generated thereby in the nickel film, through sintering at a comparatively low temperature, are believed to expand into large voids as sintering progresses at a high temperature range. Large voids forming thus in the internal electrodes may give rise to higher resistance or circuit disruption, and may lower capacitance in a capacitor.

Moreover, the sintering shrinkage behavior of the internal electrodes and the ceramic layers may fail to be matched owing to volume expansion and shrinkage brought about by oxidation and reduction reactions of nickel during firing. This mismatch gives rise to structural defects such as delamination and cracks, and detracts from yields and reliability.

Moreover, fine nickel powders have a high surface activity. Therefore, when binder removal is carried out in a non-oxidizing atmosphere such as a nitrogen atmosphere, the nickel powder acts as a decomposition catalyst on the vehicle, which may cause the resin to decompose explosively at a temperature lower than its ordinary decomposition temperature. In such cases, the sudden gas release gives rise to cracks and delamination. Also, the suddenness of the reaction prevents the resin from dissipating completely and, as a result, there remains a carbonaceous residue. This is believed to be behind such problems as deterioration of capacitor properties, occurrence of structural defects, and loss of reliability. Specifically, when the residual carbon remaining in the internal electrode layers after binder removal is oxidized, gasified and dissipated during the subsequent sintering step of the ceramic at high temperature, it draws oxygen from the ceramic layers, thereby lowering the strength of the ceramic body and worsening electric properties such as capacitance, insulation resistance and the like. Carbon may also give rise to oversintering by lowering the melting point of the nickel powder.

With a view to solving these problems, for instance, Patent Document 1 discloses forming a dense oxide film, of a certain thickness, on the surface of a nickel powder, to minimize thereby the volume and weight changes caused due to the oxidation and reduction of nickel during firing and to raise the sintering initiation temperature, thereby preventing delamination. Although forming an oxide film on the surface of a nickel powder is effective in preventing structural defects and increases in resistance, virtually no effect is elicited thereby as regards to suppressing nickel oversintering. Moreover, although the oxide film present on the surface of the nickel powder is thought to have the effect of lowering the activity of the nickel surface, such activity increases steadily when particles are of a submicron size, in particular, of a size of 0.5 μm or smaller, and thus the above oxide film fails to suppress electrode discontinuity or deterioration of the properties caused by residual carbon during binder removal.

Patent Document 2, for instance, discloses adjusting the sintering temperature, and preventing the occurrence of delamination and cracks, by using a nickel ultrafine powder, of a specific particle size, containing 0.5 to 5.0% by weight of silicon. Also, Patent Document 3 discloses shifting the temperature of abrupt thermal shrinkage initiation to a higher temperature, and preventing structural defects such as delamination and cracks, by using a composite nickel fine powder in which an oxide such as titanium oxide, silicon oxide or the like is present on the surface of a nickel powder that is subjected to a surface oxidation treatment. This method, however, was also not effective enough for electrode thinning.

Patent Document 4 discloses forming internal electrodes of a multilayer ceramic capacitor by using a conductor paste containing, as a conductive powder, an alloy powder having an average particle size of 0.01 to 1.0 μm and comprising nickel as a main component, and no more than 20 mol % of at least one element from among ruthenium, rhodium, rhenium and platinum having a melting point higher than that of nickel, to thereby curb particle growth of the nickel powder at a firing stage, even when the internal electrode layers become thinner. Spheroidizing, circuit disruption, cracks and the like can be prevented as a result, and drops in capacitance are effectively curtailed. Patent Document 5 discloses that the same effect can be achieved in a conductor paste using a powder having a coating layer that comprises at least one element from among ruthenium, rhodium, rhenium and platinum, on the surface of a nickel powder.

Patent Document 1: Japanese Patent Publication 2000-45001 A

Patent Document 2: Japanese Patent Publication 11-189802 A

Patent Document 3: Japanese Patent Publication 11-343501 A

Patent Document 4: WO 2004/070748

Patent Document 5: Japanese Patent Publication 2004-319435 A

DISCLOSURE OF THE INVENTION

Problems that the Invention is to Solve

Among the above nickel alloy powders and coated powders, especially nickel-rhenium alloy powders do not adversely affect the properties of the dielectric materials and are excellent in allowing the forming of thin internal electrode layers. Normally, however, nickel-rhenium alloy powders tend to have a higher activity than pure nickel powder and, especially when their particle size is very small, sintering proceeds fast at a low temperature during firing of the conductor paste and the above-described sudden resin decomposition may occur.

Therefore, it is an object of the present invention to provide a nickel-rhenium alloy powder, and a conductor paste using the same, wherein the rhenium-nickel alloy powder has a low activity, even when as an extremely fine powder, such as when used for forming internal electrodes of a multilayer ceramic electronic component, for instance a multilayer ceramic capacitor or the like, the rhenium-nickel alloy powder can exhibit a sintering shrinkage behavior yet closer to that of the ceramic layers, and can be prevented from undergoing oversintering at a high temperature, as a result of which, the rhenium-nickel alloy powder allows forming thinner internal electrodes of excellent continuity. In particular, it is an object of the present invention to provide a rhenium-nickel alloy powder, and a conductor paste for internal electrodes of a multilayer ceramic electronic component using the rhenium-nickel alloy powder, wherein the rhenium-nickel alloy powder allows manufacturing a high layer-count, small and highly reliable multilayer ceramic electronic component without causing structural defects or deterioration of electric properties such as capacitance, even when the internal electrodes are made thinner.

Means for Solving the Problems

To solve the above problems, the present invention encompasses the features below.

(1) A nickel-rhenium alloy powder, comprising nickel as a main component, 0.1 to 10% by weight of rhenium, and 50 to 10,000 ppm of silicon in terms of silicon atoms.

(2) The nickel-rhenium alloy powder according to (1), wherein the nickel-rhenium alloy powder has a surface oxide film.

(3) The nickel-rhenium alloy powder according to (2), wherein at least part of the silicon is present as an oxide in the surface oxide film.

(4) The nickel-rhenium alloy powder according to any one of (1) to (3), wherein the nickel-rhenium alloy powder further contains sulfur.

(5) The nickel-rhenium alloy powder according to (4), wherein the sulfur segregates near the surface of the powder.

(6) The nickel-rhenium alloy powder according to (4) or (5), wherein the content of the sulfur is 100 to 2,000 ppm, in terms of sulfur atoms, relative to the total weight of the powder.

(7) A conductor paste for forming internal electrodes of a multilayer ceramic electronic component, comprising the nickel-rhenium alloy powder according to any one of (1) to (6), as a conductive powder.

EFFECTS OF THE INVENTION

When used for forming internal electrodes of a multilayer ceramic electronic component, the silicon-containing nickel-rhenium alloy powder of the present invention delays sintering initiation and slows down the sintering progress during firing, even when in the form of an extremely fine powder, while bringing the sintering shrinkage behaviors of the electrode layers and ceramic layers closer to each other. Also, there occurs no spheroidizing of electrodes caused by oversintering. As a result there are formed low-resistance thin electrodes having few voids. Therefore, in the case of, for instance, multilayer ceramic capacitors, there is no deterioration of electric properties such as a drop in capacitance or the like, and thinner internal electrode layers and ceramic layers, which allow achieving smaller sizes and higher layer counts, can be obtained. Moreover, the invention allows obtaining a highly reliable multilayer ceramic electronic component, with a good yield and few structural defects such as delamination and cracks, also in high layer-count articles having thin ceramic layers and internal electrode layers.

In particular, the progress of sintering at a low-temperature stage can be effectively slowed down thanks to the surface oxide film on the surface of the above silicon-containing nickel-rhenium alloy powder, and especially thanks to at least part of the silicon component being present, as an oxide, in the surface oxide film. The powder, moreover, exhibits superior oxidation resistance. Thinner, high-continuity excellent internal electrode films can be formed stably as a result. The powder is also effective in stabilizing binder decomposition behavior during a binder removal step. This allows preventing the occurrence of problems caused by residual carbon. Furthermore, adding sulfur to the nickel-rhenium alloy powder of the present invention allows virtually the suppressing of the occurrence of structural defects as well as preventing deterioration of the electrical performance of the electronic ceramic component caused by the binder removal step.

BEST MODE FOR CARRYING OUT THE INVENTION

In the present invention, the rhenium content in the nickel-rhenium alloy powder ranges from 0.01 to 10% by weight relative to the total amount of alloy powder. A content of rhenium lower than 0.01% by weight weakens the inhibitory effect of rhenium on nickel oversintering, and makes it difficult to obtain thin internal electrodes, when the nickel-rhenium alloy powder is used, for instance, for internal electrodes of multilayer ceramic electronic components. A rhenium content in excess of 10% by weight makes achieving a homogeneous alloy unlikelier, and may give rise to phase separation, which causes separation of a rhenium phase or rhenium-rich phase. This impairs the properties of the nickel-rhenium alloy. When oxidized, in particular, rhenium has a property of sublimating at a low temperature, of about several hundreds of ° C. When there separates a rhenium phase or a phase rich in rhenium, thus, rhenium becomes oxidized during firing, causing the alloy composition to change. Also, the rhenium oxide sublimating out of the internal electrode portions of the formed multilayer component is detrimental to the dielectric. In particular, the rhenium content ranges preferably from 1.0 to 8.0% by weight.

The alloy composition of the individual alloy particles that make up the nickel-rhenium alloy powder need not necessarily be homogeneous. For instance, the alloy particles may have a rhenium concentration gradient from the surface toward the interior of the particles.

The present invention does not exclude a case in which the nickel-rhenium alloy powder comprises one or more other components besides nickel, as a main component, rhenium and silicon. Other components may be, for instance, metals that can be alloyed with rhenium, such as platinum, palladium, iron, cobalt, ruthenium, rhodium, etc., as well as small quantities of metal elements such as gold, silver, copper, tungsten, niobium, molybdenum, vanadium, chromium, zirconium, tantalum, etc. A light element capable of lowering the catalytic activity of nickel, such as sulfur, phosphorus, etc., may also be present in small amounts.

The average particle size of the nickel-rhenium alloy powder of the present invention ranges preferably from 0.05 to 1.0 μm. When the average particle size of the nickel-rhenium alloy powder is smaller than 0.05 μm, the activity increases excessively and it becomes difficult to inhibit sintering at a low temperature and/or resin decomposition at low temperature. Moreover, it is then necessary to use a large amount of organic components such as a solvent, a dispersant, etc., in order to carry out dispersion and achieve appropriate viscosity during manufacture of the conductor paste. As a result, this precludes achieving a dense electrode dry film during paste printing and drying, and makes it difficult to form a fired film having a good continuity. On the other hand, from the viewpoint of achieving thinner layers in response to a demand for small, high layer-count multilayer electronic components, the average particle size of the nickel-rhenium alloy powder is preferably no greater than 1.0 μm. In order to form dense and highly smooth thin internal electrode layers, in particular, there is preferably used an extremely fine powder, having an average particle size of 0.05 to 0.5 μm and a specific surface area of 1.5 to 15 m$^2$/g, and possessing a good dispersibility. Unless otherwise stated in the present invention, the average particle size of a powder denotes a specific surface area diameter calculated based on a specific surface area as measured by the BET method.

In the present invention, the silicon component may be dispersed, or present in the state of a solid solution, in the nickel-rhenium alloy powder. However, at least part of the silicon component is preferably present near the surface of the alloy powder. When an oxide film is formed on the surface of the alloy powder, the silicon component is preferably present in that surface oxide film.

Silicon lowers the activity of the nickel-rhenium alloy and adjusts its sinterability. This is thought to contribute to forming extremely thin and highly continuous internal electrode films. Silicon is more effective when present near the particle surface and allows stabilizing the binder decomposition behavior during the binder removal step of the conductor paste.

In particular, when part or the entirety of the silicon is present as an oxide on the surface oxide film of the alloy powder, the silicon oxide is believed to stabilize the oxide film by bonding with nickel oxide and/or rhenium oxide. Thereby, a firm oxide film is reliably preserved on the surface of the nickel-rhenium alloy powder up to a certain high temperature during firing. This raises, as a result, the sintering initiation temperature and curbs the progress of oxidation during firing, so that there can be formed excellent internal electrode films, which are thinner and have fewer voids, and multilayer electronic components having fewer structural defects such as cracks and delamination.

Silicon has, moreover, the effect of allowing the forming of a uniform surface oxide film on the nickel-rhenium alloy powder, as described below. During the oxidizing of the surface of the nickel-rhenium alloy powder, the presence of a silicon component in the alloy powder allows the forming reliably of an oxide film that covers the entire surface of the alloy particles thinly and uniformly. This is believed to enhance, as a result, the effect of increasing the sintering suppressing action and oxidation resistance elicited by the powder.

The silicon content is 50 to 10,000 ppm, in terms of silicon atoms, relative to the total powder weight. When the silicon content is smaller than 50 ppm, the effect of improving internal electrode continuity is not elicited, while a silicon content beyond 10,000 ppm exerts a non-negligible influence on dielectric properties. In addition, an excess of silicon may instead hamper film densification and impair electrode continuity. In order to obtain thin internal electrodes with few voids, the silicon content ranges preferably from 100 to 5,000 ppm.

Preferably, a thin oxide film is formed on the surface of the nickel-rhenium alloy powder of the present invention. Such a surface oxide film lowers the activity of the nickel-rhenium alloy powder. When such a nickel-rhenium alloy powder is used for forming the internal electrodes of a multilayer ceramic electronic component, therefore, the progress of sintering shrinkage of the internal electrodes at a low temperature range is further delayed during firing of the multilayer ceramic electronic component. This allows forming stably yet thinner internal electrode films of a high continuity and having few voids. The surface oxide film, moreover, inhibits the further progress of oxidation during firing and affords, as a result, excellent oxidation resistance. This prevents the occurrence of delamination and cracks, brought about by volume changes due to oxidation and reduction during firing. Preferably, the entire surface of the powder is covered in particular by a stable thin oxide film having an average thickness no greater than about 30 nm, specially a stable thin surface oxide film containing oxides of the alloy components, i.e. nickel oxide and rhenium oxide, as main components, since in that case the elicited effect is more pronounced.

The amount of surface oxide film is preferably about 0.1 to 3.0% by weight as a proportion of the total oxygen amount comprised in the surface oxide film relative to the total weight of the alloy powder. When the oxygen amount is smaller than 0.1% by weight, the oxide film becomes thinner and fails to cover the entire surface, thereby diminishing the effect elicited by surface oxidation. An amount of oxygen in excess of 3.0% by weight leads to greater volume changes and generation of gas due to a reduction of the oxide when the multilayer electronic component is fired in a reducing atmosphere. As a result, this precludes obtaining a dense electrode film and may give rise to cracks and/or delamination. In the present invention, the amount of oxygen in the surface oxide film of the alloy powder is expressed by a value obtained by measuring, as the ignition-loss, the percentage weight change upon heating the powder from a normal temperature to 900° C. in a reducing atmosphere composed of $N_2$ gas containing 4% of $H_2$, and then subtracting from the ignition loss the content of volatile elements other than oxygen that volatilize under such conditions, such as carbon and sulfur.

In the present invention, the nickel-rhenium alloy powder contains preferably a sulfur component. Preferably, sulfur segregates near the surface of the alloy particles. As explained above, the surface activity of the nickel-rhenium alloy powder is higher than that of pure nickel. Surface activity can be lowered by adding silicon and by oxidizing the surface so as to prevent the pure metal surface from being exposed, but further adding sulfur allows reducing the surface activity very effectively. Addition of sulfur prevents, for instance, the occurrence of sudden resin decomposition caused due to the catalytic action at a low temperature during binder removal, and prevents the occurrence of structural defects and of residual carbon, thus averting the associated lowering of the strength of the ceramic body and electrical performance.

This action is believed to result from the fact that when sulfur is present near the surface of the alloy powder particles and, in particular, when a surface oxide film is present and sulfur is present at, for instance, sites where the surface oxide film is partially thin, the catalytic activity of the particle surface is lowered as a whole, and the sulfur strongly bonds to nickel, so that it does not separate from the surface, even when the surface oxide film is reduced in a strongly reducing atmosphere during binder removal.

Preferably, the content of sulfur is 100 to 2,000 ppm, in terms of sulfur atoms, relative to the total powder weight. A sulfur content below 100 ppm results in a weak effect of lowering the surface activity, whereas a sulfur content in excess of 2,000 ppm may be detrimental to dielectric properties and may give rise to nonnegligible damage to the furnace, caused by sulfur-containing gases that are generated during firing of the multilayer ceramic electronic component.

Manufacturing Method

The method for manufacturing the nickel-rhenium alloy powder of the present invention is not limited. The method may be, for instance, atomization, wet reduction, chemical vapor deposition (CVD) by gas-phase reduction of a metal compound, physical vapor deposition (PVD) by cooling and condensing a metal vapor. Also, there may be mentioned the method involving thermal decomposition of metal compounds, for instance, the method by the applicant disclosed in Japanese Patent Publication 2002-20809 A and others in which a thermally decomposable metal compound powder is pyrolyzed while dispersed in a gas phase, as well as the method by the applicant disclosed in Japanese Patent Publication 2007-138280 A (Japanese Patent Application 2006-71018). The method set forth in Japanese Patent Publication 2007-138280 A is particularly preferable, since it allows manufacturing a compositionally homogeneous fine nickel-rhenium alloy powder, easily and stably. In the manufacturing method proposed in Japanese Patent Publication 2007-138280 A, main-component metal particles of nickel or the like, in the form of a solid phase and/or liquid phase, are dispersed in a gas phase. Rhenium is deposited on the surface of these metal particles through reduction of a vapor of a rhenium oxide, and is caused to diffuse into the particles at a high temperature.

The method for incorporating silicon into the nickel-rhenium alloy powder is not particularly limited. For instance, when the nickel-rhenium alloy powder is manufactured in accordance with the above-described methods, a silicon-containing nickel-rhenium alloy powder may be formed by including silicon or a silicon compound in the starting materials. The silicon-containing nickel-rhenium alloy powder may also be formed by adding a silicon compound gas or volatile silicon compound vapor to the manufacturing atmosphere during manufacture of the nickel-rhenium alloy powder. Alternatively, the silicon-containing nickel-rhenium alloy powder may be formed by dispersing the nickel-rhenium alloy powder in a solution comprising a silicon compound or a silicon oxide colloid, followed by a thermal treatment. For instance, in the manufacturing method disclosed in Japanese Patent Publication 2007-138280 A, a method involving including silicon beforehand in the starting-material nickel powder or feeding a gaseous silicon compound, such as a silane compound or a siloxane compound, together with a rhenium oxide vapor, or the like is preferably adopted.

The method for forming the surface oxide film on the nickel-rhenium alloy powder of the present invention is not limited, and may involve forming a given amount of oxide on the surface of the alloy powder by subjecting the alloy powder to a thermal treatment in an oxidizing atmosphere while preventing agglomeration of the powder. Further, for instance, in the case of the vapor deposition method, the method involving pyrolyzing a thermally decomposable metal compound powder in a gas phase, as set forth in Japanese Patent Publication 2002-20809 A or others, the method set forth in Japanese Patent Publication 2007-138280 A or the like, in the course of cooling the alloy powder formed at a high temperature, preferably an oxidizing gas such as air may be mixed therewith while retaining the formed powder in a dispersed state in a gas phase because a homogeneous thin oxide film can be formed instantly without agglomeration of the powder. In such a way, the oxidation amount can be adjusted on the basis of, for instance, the temperature at which the formed particles and the oxidizing gas come into contact with each other.

To form a thin, homogeneous and stable surface oxide film effectively, there may be used the carbon-amount lowering method of the present applicants disclosed in Japanese Patent Publication 2007-157563 A (Japanese Patent Application 2005-352925), in which the amount of carbon impurities in a nickel-rhenium alloy powder is reduced. In that case, the carbon content is preferably controlled so that the weight ratio (in terms of carbon atoms) of carbon content relative to a unit weight of the alloy powder does not exceed 200 ppm per 1 $m^2$/g of the specific surface area of the powder.

To incorporate silicon in the surface oxide film, the surface of the nickel-rhenium alloy powder may for instance be brought into contact, after surface oxidation, with a silicon compound, followed by a thermal treatment. Alternative methods involve, for instance, subjecting a silicon-containing nickel-rhenium alloy powder, obtained in accordance with the above-described various methods, to a surface oxidation treatment, to cause at least part of the silicon to be taken up, in the form of an oxide, within the surface oxide film. For instance, in the case where an alloy powder formed at a high temperature is dispersed in a gas phase, as described above, and is then surface-oxidized, as-is, with an oxidizing gas, having incorporated silicon beforehand in the alloy powder causes the silicon component to be driven towards the surface of the nickel-rhenium alloy powder, whereby the silicon component becomes taken up into the oxide film. Thus, a surface oxide film comprising silicon oxide can be formed. This method is preferable in that silicon has the effect of causing the surface oxide film to be formed uniformly on the nickel-rhenium alloy powder and allows the formation of a thin oxide film uniformly coating the entire surface of the alloy particles therewith.

Likewise, the method for incorporating sulfur into the nickel-rhenium alloy powder is not limited. Such a method may involve, for instance, mixing the alloy powder and sulfur powder and then heating the mixture in a hermetically closed container, or a method in which a sulfur-containing gas, such as hydrogen sulfide gas or sulfurous acid gas is made to react with an alloy powder by being made to flow through the latter. Further, in the vapor deposition method, the method involving pyrolyzing a thermally decomposable metal compound powder in a gas phase, as set forth in Japanese Patent Publication 2002-20809 A or others, the method set forth in Japanese Patent Publication 2007-138280 A or the like, a sulfur compound may be included in an alloy starting material, or a gas such as hydrogen sulfide gas, sulfurous acid gas or a gas of a mercaptan-based organic sulfur compound may be added into the reaction system, to yield a sulfur-containing nickel-rhenium alloy powder.

Conductor Paste

The conductor paste of the present invention contains at least the above nickel-rhenium alloy powder as a conductive powder. The conductor paste is obtained by dispersing the nickel-rhenium alloy powder in a vehicle comprising a resin binder and a solvent.

The resin binder is not particularly limited, and may be a resin binder ordinarily used in conductor pastes, for instance ethyl cellulose, hydroxyethyl cellulose and other cellulose resins, as well as an acrylic resin, a methacrylic resin, a butyral resin, an epoxy resin, a phenolic resin, rosin or the like. The amount of the resin binder is not particularly limited, but is usually of about 1 to 15 parts by weight relative to 100 parts by weight of conductive powder.

The solvent used is not particularly limited so long as it will dissolve the above binder resin, and may be appropriately selected from among solvents ordinarily used in conductor pastes. Examples thereof include organic solvents such as alcohols, ketones, ethers, esters, hydrocarbons and the like, as well as water and mixed solvents of the foregoing. The amount of solvent is not particularly limited, provided that it is an amount ordinarily employed. The amount of solvent is appropriately determined in accordance with, for instance, the nature of the conductive powder, the type of resin and the coating method. Ordinarily, the amount of solvent is about 40 to 150 parts by weight per 100 parts by weight of conductive powder.

In addition to the above components, the conductor paste of the present invention can also arbitrarily contain, according to its intended use, any components that are ordinarily added, such as inorganic powders such as a ceramic that is the same as, or whose composition is similar to that of, ceramics contained in ceramic green sheets; and also glass, metal oxides such as alumina, silica, zirconia, copper oxide, manganese oxide and titanium oxide and montmorillonite; as well as metalorganic compounds, plasticizers, dispersants, surfactants and the like.

The conductor paste of the present invention is manufactured by kneading a nickel-rhenium alloy powder, together with other additive components, in a vehicle, in accordance with known methods, so that the nickel-rhenium alloy powder becomes homogeneously dispersed. The above paste form is not exclusive, and may be a paint or an ink form instead. In particular, the obtained conductor paste is suitable for forming internal electrodes of multilayer ceramic electronic components such as multilayer capacitors, multilayer inductors, multilayer actuators and the like. The conductor paste of the present invention can also be used in terminal electrodes of ceramic electronic components, and in the formation of other thick-film conductor circuits.

EXAMPLES

The present invention is explained next in detail on the basis of examples. The invention, however, is in no way meant to be limited to or by the examples.

Examples 1 to 5

A powder of nickel acetate tetrahydrate was fed to a jet-mill at a feed rate of 2000 g/hr, and was pulverized and dispersed with nitrogen gas at a flow rate of 200 L/min.

Separately, rhenium oxide ($Re_2O_7$) was heated to 300° C. to generate a rhenium oxide vapor that was fed into the gas stream in which the above-mentioned nickel acetate powder had been dispersed, at a feed rate of about 30 g/hr in terms of rhenium metal, using nitrogen gas at a flow rate of 10 L/min as a carrier. Further, a tetraethoxysilane solution diluted with isopropyl alcohol was vaporized using heated nitrogen gas at a flow rate of 10 L/min, and was fed into the gas stream having the nickel acetate powder dispersed therein. The feeding amount of tetraethoxysilane was adjusted in accordance with the feeding amount and the concentration of the tetraethoxysilane solution. The dispersed gas stream was introduced into a reaction tube in an electric furnace heated to 1550° C. After passing through the electric furnace, the gas stream was cooled to about 100° C., after which the produced powder was recovered with a bag filter. Air inlet pipes were provided in the cooling line, to oxidize the surface of the produced powder through infusion of air.

Observation under a scanning electron microscope (SEM) revealed that the powders thus produced were composed of, in all cases, spherical particles having a uniform particle size (about 0.3 μm or smaller in average particle size) and having a good dispersibility. Observation under a scanning transmission electron microscope (STEM) revealed that an oxide film was formed on the particle surface. Inspection by electron spectroscopy for chemical analysis (ESCA) revealed that the surface oxide film contained nickel oxide, rhenium oxide and silicon oxide. The average thickness of the surface oxide film was about 10 to 20 nm. Analysis of the powder using an X-ray diffractometer revealed that the nickel diffraction lines were slightly shifted to lower angles, while no diffraction lines were observed other than those of nickel. This indicated that rhenium was alloyed with nickel in a solid solution state.

Table 1 summarizes the specific surface area, average particle size, rhenium content, silicon content, oxygen content, sulfur content and carbon content for each of the obtained powders. The specific surface area was measured in accordance with the BET method. The average particle size was converted from the specific surface area. The rhenium content and the silicon content were quantified by inductively coupled plasma spectrometry (ICP). To measure the oxygen content, about 2 g of the powder was weighed on an alumina boat and the percentage weight change (%) (ignition loss) when heating the powder from a normal temperature up to 900° C. in $N_2$ gas containing 4% of $H_2$ followed by cooling it to room temperature was measured. The carbon content and the sulfur content were subtracted from the measured ignition loss, to yield the oxygen content value. The sulfur and carbon contents were measured using a carbon-sulfur analyzer (EMIA-320V, by Horiba Ltd.). Since sulfur is not purposely added in the present example, it is considered here to be an impurity arising from the starting materials or introduced during the process.

Measurement of Powder Properties

The sintering shrinkage behavior of each powder was studied as follows. The powder was molded into a cylindrical specimen having a diameter of 5 mm and a height of approximately 3 mm, and thermomechanical analysis (TMA) was carried out by heating the specimen from room temperature to 1300° C. at a temperature rise rate of 5° C./min in $N_2$ gas containing 4% of $H_2$. On the basis of the measurement results, the temperature corresponding to a 20% shrinkage relative to the shrinkage at 1300° C. is given in Table 1 as the TMA shrinkage temperature.

The binder removal characteristic of the conductor paste was evaluated as follows. 100 parts by weight of the obtained alloy powder, 5 parts by weight of ethyl cellulose as the resin binder and 95 parts by weight of dihydroterpineol as the solvent were mixed and kneaded using a 3-roll mill to prepare a conductor paste. The obtained conductor paste was coated onto a PET film, to a thickness of 250 μm, and was dried at 150° C. to remove the solvent. The dry film was heated to 500° C. in a nitrogen gas atmosphere at a temperature rise rate of 20° C. per minute and subjected to thermogravimetric measurement to examine the decomposition initiation temperature of the resin. The thus obtained decomposition initiation temperature is shown as the binder removal temperature in Table 1.

The continuity of the fired film (fired film coverage) was measured as follows. 100 parts by weight of the obtained alloy powder, 20 parts by weight of barium titanate powder of 50 nm particle size, 5 parts by weight of ethyl cellulose as the resin binder and 95 parts by weight of dihydroterpineol were mixed and kneaded using a 3-roll mill to prepare a conductor paste. The obtained conductor paste was coated onto an alumina substrate to a coating amount of 0.8 mg/cm$^3$, on a metal basis, and fired at 1200° C. in $N_2$ gas containing 4% of $H_2$. The fired film was examined by SEM, and the observed images were processed to measure the substrate coverage of the fired film as given in Table 1, where the larger figures denote better continuity.

Examples 6 to 10

Nickel-rhenium alloy powders were manufactured under the same conditions as in Examples 1 to 5 except that hydrogen sulfide gas diluted with nitrogen gas was fed also into the gas stream of dispersed nickel acetate powder, in addition to rhenium oxide vapor and tetraethoxysilane vapor.

The powders were analyzed in the same way as in Examples 1 to 5. In all cases, alloy powders thus manufactured were composed of spherical particles of uniform particle size, having a surface oxide film, and exhibiting good dispersibility. An ESCA analysis revealed that the surface oxide film contained nickel oxide, rhenium oxide and silicon oxide, and that sulfur was present near the surface of the particles.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the obtained powders, which were measured in the same way as in Examples 1 to 5.

Example 11

A nickel-rhenium alloy powder was manufactured in the same way as in Examples 6 to 10, but without carrying out surface oxidation.

Analysis carried out as above revealed that the obtained powder was an alloy powder composed of spherical particles of uniform particle size, substantially unoxidized and exhibiting good dispersibility. Silicon and sulfur were found in the vicinity of the particle surface.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the obtained powder, which were measured in the same way as in Examples 1 to 5.

Examples 12 to 13

Alloy powders were manufactured under the same conditions as in Examples 6 to 10 except that the feed amount of rhenium oxide vapor was varied to have a different rhenium content in the alloy powders.

The powders were analyzed in the same way as above, and revealed themselves to be nickel-rhenium alloy powders composed of particles of uniform particle size, having a surface oxide film, and exhibiting good dispersibility. Analysis revealed that the surface oxide film contained nickel oxide, rhenium oxide and silicon oxide, and that sulfur was present near the surface of the particles.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the obtained powders, which were measured in the same way as in Examples 1 to 5.

Example 14

A nickel-rhenium alloy powder was manufactured under the same conditions as in Examples 1 to 5 but with the feed rate of nickel acetate tetrahydrate now being 5000 g/hr and the feed rate of rhenium oxide vapor being about 80 g/hr, in terms of rhenium metal.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the obtained powder, which were measured in the same way as in Examples 1 to 5.

Example 15

A nickel-rhenium alloy powder was manufactured under the same conditions as in Examples 6 to 10 but with the feed rate of nickel acetate tetrahydrate now being 200 g/hr and the feed rate of rhenium oxide vapor being about 3 g/hr, in terms of rhenium metal.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the obtained powder, which were measured in the same way as in Examples 1 to 5.

Comparative Examples 1 to 2

Nickel-rhenium alloy powders were manufactured under the same conditions as in Examples 1 to 5, but without feeding any tetraethoxysilane. No surface oxidation treatment was carried out in Comparative Example 2.

Comparative Example 3

A nickel-rhenium alloy powder was manufactured under the same conditions as in Examples 1 to 5, but adjusting the feed amount of tetraethoxysilane solution to yield the silicon amount as given in Table 1.

Comparative Example 4

A silicon-containing nickel powder having a nickel oxide and a silicon oxide in the surface oxide film thereof was manufactured under the same conditions as in Examples 1 to 5, but without feeding any rhenium oxide vapor.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the powders obtained in Comparative Examples 1 to 4, which were measured in the same way as in Examples 1 to 5. The traces of silicon detected in Comparative Examples 1 to 2 and the traces of sulfur detected in Comparative Examples 1 to 4 are considered to be impurities arising from the starting materials or introduced during the process.

A comparison between the results of Examples 1 to 5 and the comparative examples in Table 1 shows that adding silicon causes the TMA shrinkage temperature to rise, and the coverage of the fired film to improve, as the amount of silicon increases. The binder removal temperature rises also through addition of silicon, which shows that silicon inhibits the catalytic activity of the particle surface. However, Comparative Example 3 shows that coverage of the fired film decreases when the silicon content exceeds 10,000 ppm, in terms of silicon atoms. Comparative Example 4 shows that the above-described effect of silicon is obtained in rhenium-containing nickel alloys, and that thinning of internal electrodes is difficult when no rhenium is present. In Examples 6 to 11, adding sulfur causes the binder removal temperature to rise, which indicates the inhibitory effect of sulfur on catalytic activity. The results show that adding silicon and sulfur simultaneously allows inhibiting binder removal activity and increasing fired film coverage, without using excessive amounts of either silicon or sulfur.

Table 1

TABLE 1

| | Specific surface area ($m^2/g$) | Average particle size (μm) | Rhenium content (% by weight) | Silicon content (ppm) | Oxygen content (% by weight) | Sulfur content (ppm) | Carbon content (ppm) | TMA shrinkage temperature (°C.) | Binder removal temperature (°C.) | Fired film coverage (%) |
|---|---|---|---|---|---|---|---|---|---|---|
| Example 1 | 2.5 | 0.27 | 7.0 | 80 | 1.27 | 40 | 310 | 480 | 340 | 85 |
| Example 2 | 2.4 | 0.28 | 6.9 | 130 | 1.17 | 40 | 290 | 560 | 345 | 90 |
| Example 3 | 2.5 | 0.27 | 6.9 | 470 | 0.93 | 30 | 130 | 680 | 351 | 95 |
| Example 4 | 2.6 | 0.26 | 7.0 | 1150 | 1.17 | 40 | 200 | 700 | 358 | 97 |
| Example 5 | 2.5 | 0.27 | 7.0 | 9700 | 0.76 | 40 | 180 | 780 | 363 | 81 |
| Example 6 | 3.2 | 0.21 | 6.5 | 140 | 0.84 | 100 | 350 | 510 | 335 | 91 |
| Example 7 | 2.5 | 0.27 | 6.6 | 200 | 0.53 | 240 | 140 | 550 | 350 | 94 |
| Example 8 | 2.5 | 0.27 | 7.1 | 120 | 0.56 | 630 | 120 | 570 | 365 | 92 |
| Example 9 | 2.6 | 0.26 | 7.1 | 110 | 0.90 | 1800 | 180 | 580 | 368 | 91 |
| Example 10 | 2.5 | 0.27 | 7.2 | 730 | 0.56 | 690 | 200 | 690 | 367 | 98 |
| Example 11 | 2.5 | 0.27 | 7.0 | 4500 | 0.05 | 1900 | 400 | 710 | 363 | 89 |
| Example 12 | 2.6 | 0.26 | 5.0 | 700 | 0.50 | 650 | 320 | 650 | 368 | 93 |
| Example 13 | 2.6 | 0.26 | 3.0 | 720 | 0.54 | 640 | 310 | 600 | 368 | 90 |
| Example 14 | 1.1 | 0.61 | 7.0 | 210 | 0.48 | 30 | 130 | 590 | 348 | 87 |
| Example 15 | 6.3 | 0.11 | 6.8 | 1830 | 1.51 | 1260 | 280 | 690 | 367 | 98 |
| Comparative Example 1 | 2.9 | 0.23 | 7.3 | 40 | 0.77 | 40 | 320 | 430 | 323 | 72 |
| Comparative Example 2 | 2.4 | 0.28 | 7.0 | 20 | 0.06 | 40 | 450 | 380 | 287 | 65 |
| Comparative Example 3 | 2.7 | 0.25 | 7.0 | 12400 | 0.88 | 40 | 150 | 790 | 364 | 74 |
| Comparative Example 4 | 2.6 | 0.26 | 0.0 | 700 | 1.28 | 40 | 190 | 580 | 361 | 66 |

The invention claimed is:

1. A nickel-rhenium alloy powder, comprising nickel as a main component, 0.1 to 10% by weight of rhenium, and 50 to 10,000 ppm of silicon in terms of silicon atoms, wherein the nickel-rhenium alloy powder has a surface oxide film.

2. The nickel-rhenium alloy powder according to claim 1, wherein at least part of the silicon is present as an oxide in the surface oxide film.

3. A conductor paste for forming internal electrodes of a multilayer ceramic electronic component, comprising the nickel-rhenium alloy powder according to claim 1, as a conductive powder.

4. A nickel-rhenium alloy powder, comprising nickel as a main component, 0.1 to 10% by weight of rhenium, and 50 to 10,000 ppm of silicon in terms of silicon atoms, wherein the nickel-rhenium alloy powder further contains sulfur.

5. The nickel-rhenium alloy powder according to claim 4, wherein the sulfur segregates near a surface of the powder.

6. The nickel-rhenium alloy powder according to claim 4, wherein a content of the sulfur is 100 to 2,000 ppm, in terms of sulfur atoms, relative to a total weight of the powder.

7. The nickel-rhenium alloy powder according to claim 4, wherein the nickel-rhenium alloy powder has a surface oxide film.

8. The nickel-rhenium alloy powder according to claim 7, wherein at least part of the silicon is present as an oxide in the surface oxide film.

9. A conductor paste for forming internal electrodes of a multilayer ceramic electronic component, comprising the nickel-rhenium alloy powder according to claim 4, as a conductive powder.

* * * * *